United States Patent [19]
Noguchi et al.

[11] Patent Number: 5,111,100
[45] Date of Patent: May 5, 1992

[54] SURFACE ACOUSTIC WAVE DEVICE AND METHOD FOR FABRICATING SAME

[75] Inventors: Osamu Noguchi; Kazuyoshi Sugai, both of Tokyo, Japan

[73] Assignee: Clarion Co., Ltd., Tokyo, Japan

[21] Appl. No.: 637,058

[22] Filed: Jan. 3, 1991

[30] Foreign Application Priority Data

Jan. 12, 1990 [JP] Japan .................................. 2-5903

[51] Int. Cl.⁵ ............................................. H01L 41/07
[52] U.S. Cl. .............................. 310/313 A; 310/313 R; 310/319 D
[58] Field of Search ........... 310/313 R, 313 A, 313 B, 310/313 D; 333/150, 153, 154, 193

[56] References Cited

U.S. PATENT DOCUMENTS

| | | | |
|---|---|---|---|
| 4,194,171 | 3/1980 | Jelks | 310/313 R X |
| 4,567,393 | 1/1986 | Asai et al. | 310/313 A |
| 4,611,140 | 9/1986 | Whitlock et al. | 310/313 B |
| 4,665,374 | 5/1987 | Fathimulla | 310/313 R X |
| 4,697,115 | 9/1987 | Mitsutsuka | 310/313 D |
| 4,757,226 | 7/1988 | Mitsutsuka et al. | 310/313 A |

Primary Examiner—Mark O. Budd
Attorney, Agent, or Firm—Flynn, Thiel, Boutell & Tanis

[57] ABSTRACT

A surface acoustic wave device is disclosed, by which it is possible to improve characteristics of a system suitable for suppressing narrow frequency band interference, which is useful for a spread spectrum communication system, and to increase the signal intensity at the detecting portion without changing characteristics of the filter portion.

In a surface acoustic wave element, in a p conductivity type Si epitaxial layer 2 formed on a p+ conductivity type Si monocrystal substrate 1 the epitaxial layer on the siganl detecting portion is formed so as to be thinner than the other portion by means of a buried layer.

In this way, even with a same intensity of the input signal at the transducer, the loss of SAW is reduced and as the result the intensity of the detected signal is increased.

By the present invention it is possible to increase the signal intensity at the detecting portion without changing characteristics of the filter portion.

4 Claims, 5 Drawing Sheets

SURFACE ACOUSTIC WAVE DEVICE AND METHOD FOR FABRICATING SAME

FIELD OF THE INVENTION

The present invention relates to an improvement of a surface acoustic wave device and a method for fabricating same suitable for a spread spectrum communication system.

BACKGROUND OF THE INVENTION

One of the problems in a spread spectrum communication system using a wide frequency band consists in that communication is made impossible or the error rate is increased by a narrow band interference at a high level. In order to solve this problem, a filter using surface acoustic wave ( hereinbelow abbreviated to SAW ) has been invented.

In order to try to increase the performance of a system suitable for suppressing the narrow band interference, which is useful for the spread spectrum communication system, the inventors of the present invention have proposed a surface acoustic wave device (indicated in FIGS. 6 and 7 of the present application) in JP-A-Hei 1-267503 (which corresponds to U.S. Ser. No. 07/521,142).

In the figure, reference numeral 1 is a p' conductivity type Si monocrystal substrate; 2 is a p conductivity type Si epitaxial layer; 3 is a thermal oxide layer; 4 is a ZnO piezo-electric layer; 5, 6 and 7 are metal electrodes, which are input transducer means formed on the piezo-electric layer 4 and classifying an input signal in the frequency to generate a plurality of surface acoustic waves at respective frequencies traveling along respective propagation paths (channels), output transducer means formed on the piezo-electric layer 4, each of the output transducer means obtaining an output signal from a SAW propagated through a respective one of the propagation paths, and gate electrode means formed on the piezo-electric layer 4, each of them corresponding to a respective one of the propagation paths, respectively; 8 is a p' conductivity type high impurity concentration diffusion region formed in the epitaxial layer 2 under the input transducer means or the output transducer means; 9 is an n' conductivity type diffusion region formed in the epitaxial layer under the gate electrode; 10 is an n' conductivity type diffusion region formed in the epitaxial layer 2 outside of the input transducer means 5; and 7' is gate electrode means formed on the piezo-electric layer, corresponding to the n' conductivity type diffusion region. First pn diode array means are formed along the SAW propagation paths by the n' conductivity type diffusion region 9 and on the other hand second pn diode array means are formed along the SAW propagation paths by the n' conductivity type diffusion region 10. 11 is a resistor connected with each of the pn diode array means 9 and 10; 12 is a DC power supply; and 13 is a terminal for monitoring a voltage signal obtained by transforming an input signal into SAW detecting it by means of the second pn diode array means, by means of which terminal the intensity (electric power) of the input signal within the relevant channel (frequency region) is observed in the form of variations in the voltage. 14 is a bias control terminal for the first pn diode array means.

FIG. 8 shows a surface acoustic wave device of the above-mentioned type, which has n channels of the above-indicated SAW components connected in parallel. In particular, each of the n channels includes two diode arrays 9 and 10, an input transducer 5 between the diode arrays, and an output transducer on the opposite side of the diode array 9 from input transducer 5. Each input transducer generates surface acoustic waves at a respective frequency, which propagate along a respective one of 17 propagation paths 20.

According to the invention of the older application described above a function of monitoring the spectrum intensity of the input signal is added to the construction of a prior art element. By the prior art element only one of the signal intensities of the SAWs excited by the input transducer means and propagating in the two directions is controlled by the pn diode array means disposed on the propagation paths and the SAW propagating in the reverse direction is not used.

According to the invention of the older application the signal intensity of this SAW propagating in the reverse direction is detected by the pn diodes to obtain information on the spectrum intensity of the input signal so that the propagation control can be effected by a lower input power by means of a feedback circuit.

In the surface acoustic wave element according to the invention of the older application, contrarily to the fact that in the filter portion it is desirable that the epitaxial layer is thick in order to increase the loss of the SAW, in the detecting portion in order to increase the intensity of the detected signal, it is desirable that the epitaxial layer is thin from the point of view to decrease the loss of the SAW. However, since the invention of the older application attaches great importance to characteristics of the filter portion, the epitaxial layer is thick and as the result it has a drawback that the detected signal is small.

OBJECT OF THE INVENTION

The object of the present invention is to provide a surface acoustic wave device and a method for fabricating same capable of increasing the performance of a system suitable for suppressing the narrow band interference, which is useful for the spread spectrum communication system, and at the same time increasing the signal intensity in the detecting portion without changing the characteristics of the filter portion.

SUMMARY OF THE INVENTION

In order to achieve the above object, a surface acoustic wave device according to a first invention of the present application comprises:

a multi-layered structure including a first conductivity type high impurity concentration silicon substrate, a first conductivity type silicon epitaxial layer, an insulating layer and a piezo-electric layer;

input transducers formed on the piezo-electric layer stated above and classifying an input signal in the frequency to generate a plurality of surface acoustic waves at respective frequencies traveling along respective propagation paths;

output transducers formed on the piezo-electric layer stated above, each of the output transducers obtaining an output signal from a surface acoustic wave propagated through a respective one of the propagation paths;

a group of gate electrodes formed on the piezo-electric layer stated above, each corresponding to a respective one of the propagation paths;

a group of first pn diode arrays formed on the surface side of the first conductivity type silicon epitaxial layer stated above in a region comprised between the input and the output transducers; and a group of second pn diode arrays formed on the surface side of the first conductivity type silicon epitaxial layer stated above in a region opposite to the group of first pn diode arrays with respect to the input transducers stated above;

wherein the first conductivity type silicon epitaxial layer stated above is thinner on the side of the group of second pn diode arrays than on the side of the group of first pn diode arrays.

A surface acoustic wave device according to a second invention of the present application comprises:

a first conductivity type high impurity concentration silicon substrate;

a first conductivity type silicon epitaxial layer;

a first conductivity type high impurity concentration buried layer formed partially in the epitaxial layer stated above;

first pn diode array means formed on the surface side of the first conductivity type silicon epitaxial layer stated above in a region where the buried layer stated above is not formed;

second pn diode array means formed on the surface side of the epitaxial layer above the buried layer stated above;

an insulating layer formed on the epitaxial layer stated above;

a piezo-electric layer formed further on the insulating layer stated above;

first gate electrode means formed on the piezo-electric layer stated above above the group of first pn diode arrays stated above;

second gate electrodes formed on the piezo-electric layer stated above above the second pn diode array means stated above;

input transducer means formed on the piezo-electric layer stated above in a region comprised between the first and the second gate electrode means stated above; and output transducer means formed on the piezo-electric layer stated above in a region opposite to the input transducer means with respect to the second gate electrode means stated above.

A method for fabricating a surface acoustic wave device according to a third invention of the present application comprises:

a first step of forming a first conductivity type first epitaxial layer on a first conductivity type high impurity concentration silicon substrate;

a second step of forming a first conductivity type high impurity concentration buried layer on the surface of the first conductivity type epitaxial layer stated above in a predetermined region;

a third step of forming further a first conductivity type second epitaxial layer on the first conductivity type first epitaxial layer stated above including the buried layer stated above, which second epitaxial layer is similar to the first conductivity type epitaxial layer stated above;

a fourth step of forming diode array means consisting of second conductivity type high impurity concentration layers on the surface portion of the first conductivity type second epitaxial layer formed in the third step described above above the first conductivity type high impurity concentration buried layer stated above and another portion, respectively;

a fifth step of superposing a piezo-electric layer on the first conductivity type second epitaxial layer stated above; and a sixth step of forming transducer means and gate electrode means on the piezo-electric layer stated above.

A method for fabricating a surface acoustic wave device according to a fourth invention of the present application comprises:

a first step of forming a first conductivity type first epitaxial layer on a first conductivity type high impurity concentration silicon substrate;

a second step of forming a first conductivity type high impurity concentration buried layer on the surface of the first conductivity type epitaxial layer stated above in a predetermined region;

a third step of forming further a first conductivity type second epitaxial layer on the first conductivity type first epitaxial layer stated above including the buried layer stated above, which second epitaxial layer is similar to the first conductivity type epitaxial layer stated above;

a fourth step of forming a thermal oxide layer on the first conductivity type second epitaxial layer;

a fifth step of forming diode array means consisting of second conductivity type high impurity concentration layers on the surface portion of the first conductivity type second epitaxial layer formed in the third step described above above the first conductivity type high impurity concentration buried layer stated above and another portion, respectively;

a sixth step of superposing a piezo-electric layer on the thermal oxide layer stated above; and a seventh step of forming transducer means and gate electrode means on the piezo-electric layer stated above.

In the surface acoustic wave devices thus constructed, since the epitaxial layer serving as the detecting portion is thinner than the other portion because of the buried layer thus formed, the loss of the SAW decreases. Consequently, since the electric power in the detecting portion increases, the intensity of the detected signal increases as the result thereof.

DETAILED DESCRIPTION

Figure 1A:
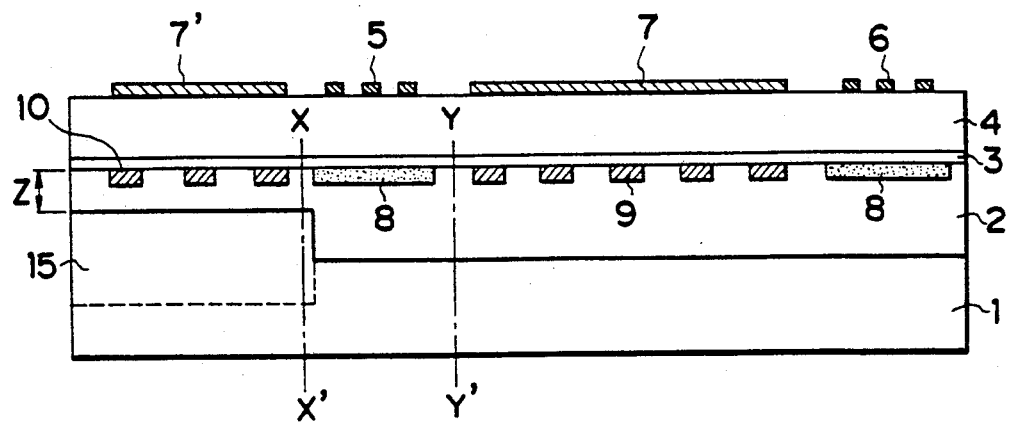
FIG. 1A is a scheme showing the construction of a surface acoustic wave device, which is an embodiment of the present invention.
Figure 1B:
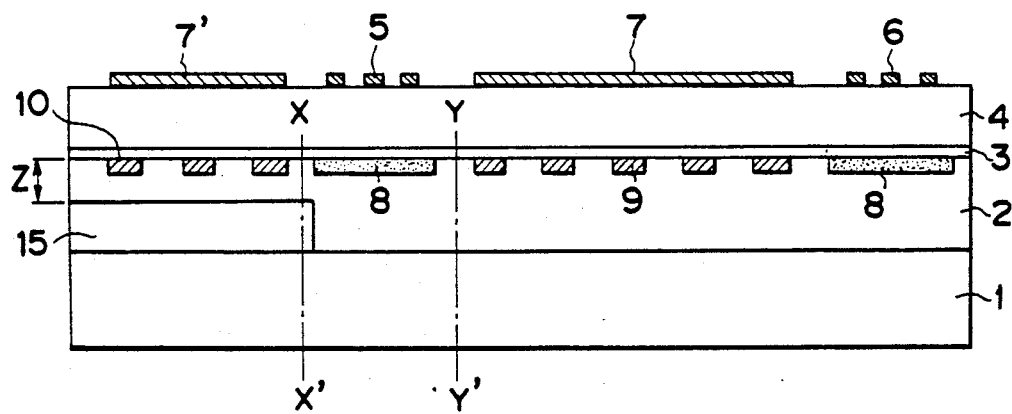
FIG. 1B is a scheme showing the construction of a surface acoustic wave device, which is another embodiment of the present invention.
Figure 1C:
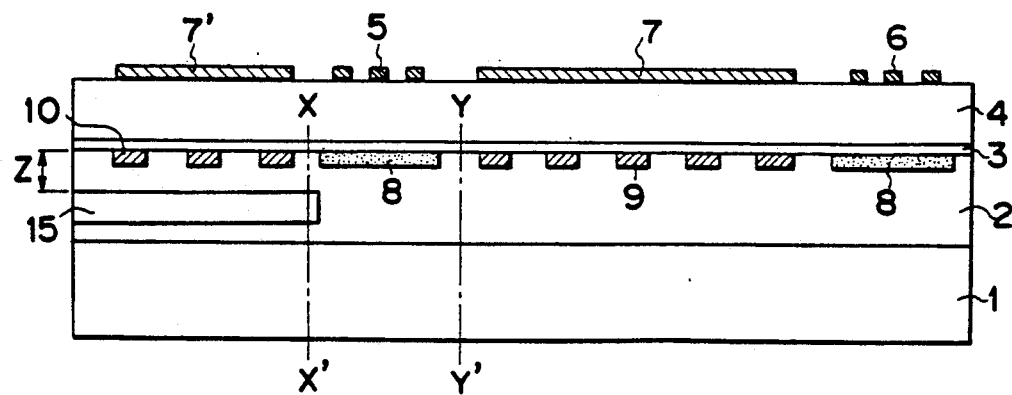
FIG. 1C is a scheme showing the construction of a surface acoustic wave device, which is still another embodiment of the present invention.
Figure 6:
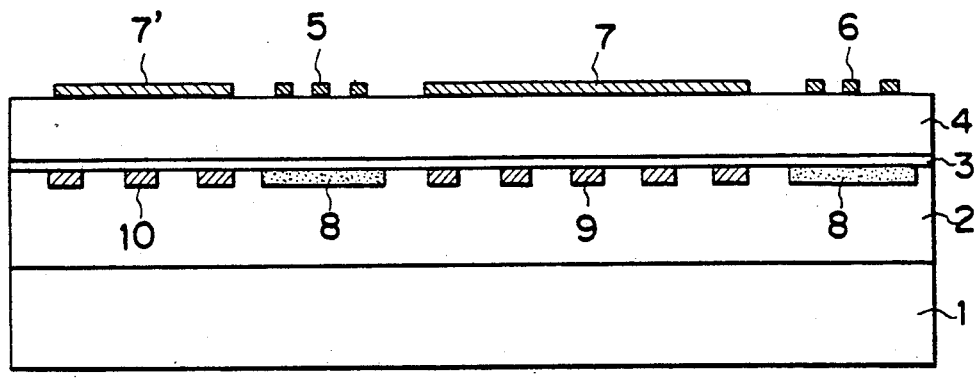
FIG. 6 is a scheme showing the construction of a surface acoustic wave element according to the invention described in the older application.
Figure 7:
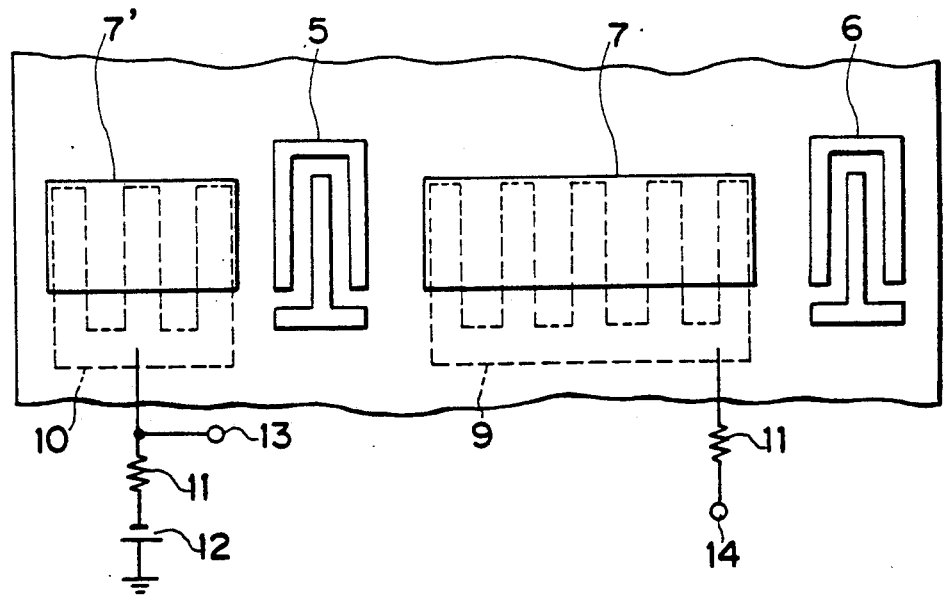
FIG. 7 is a plan view of the element indicated in FIG. 6.
Figure 8:
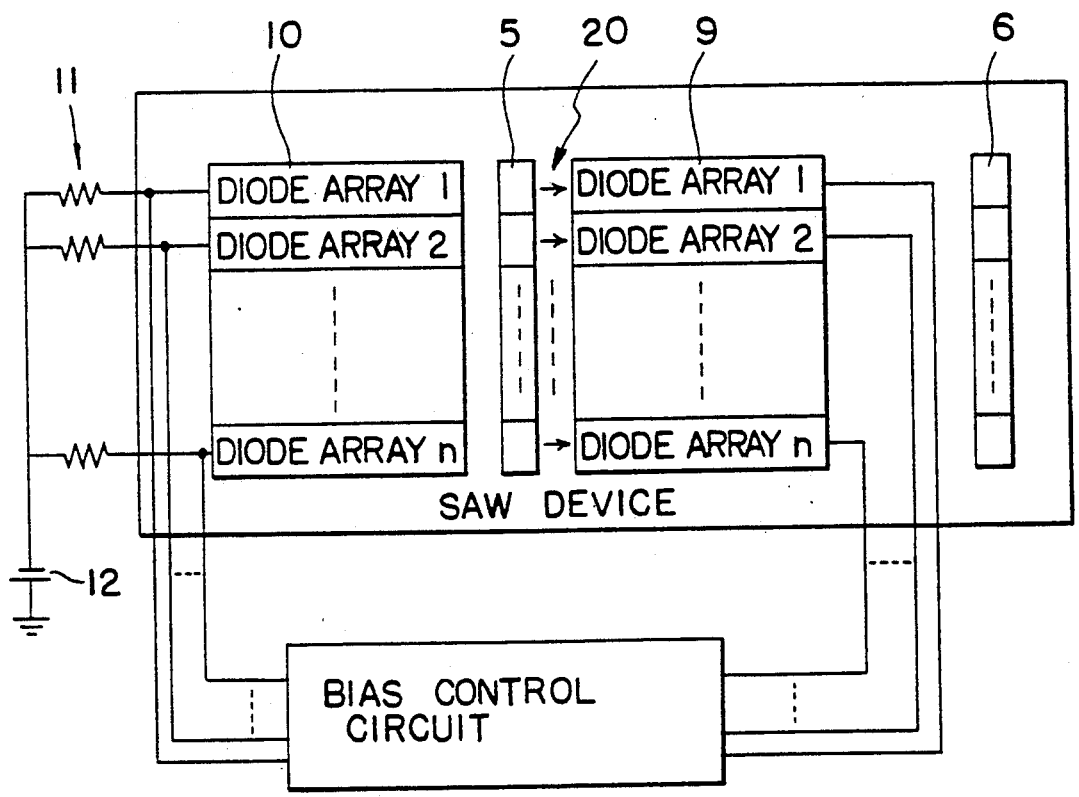
FIG. 8 is a plan view of a surface acoustic wave device.

FIGS. 1A to 1C illustrate surface acoustic wave elements according to different embodiments of the present invention, in which the parts identical or anologous to those indicated in FIGS. 6 and 7 are referred to by same reference numerals.

That is, reference numeral 1 is a p+ conductivity type Si monocrystal substrate; 2 is a p conductivity type Si epitaxial layer; 3 is a thermal oxide layer; 4 is a ZnO piezo-electric layer; 5, 6 and 7 are metal electrodes, which are input transducer means formed on the piezo-electric layer 4 and classifying an input signal in the frequency to generate a plurality of surface acoustic waves at respective frequencies traveling along respective propagation paths (channels), output transducer means formed on the piezo-electric layer 4, each of the output transducer means obtaining an output signal from a SAW propagated through a respective one of the propagation paths, and gate electrode means formed on the piezo-electric layer 4, each of them corresponding to a respective one of the propagation paths, respectively; 8 is a p+ conductivity type high impurity concentration diffusion region formed in the epitaxial layer 2 under the input transducer or the output transducer; 9 is an n+ conductivity type diffusion region formed in the epitaxial layer under the gate electrode means; 10 is an n+ conductivity type diffusion region formed in the epitaxial layer 2 outside of the input transducer means 5; and 7' is gate electrode means formed on the piezo-electric layer, corresponding to the n+ conductivity type diffusion region. First pn diode array means are formed along the SAW propagation paths by the n+ conductivity type diffusion region 9 and on the other hand second pn diode array means are formed along the SAW propagation paths by the n+ conductivity type diffusion region 10.

The resistor 11, the DC power supply 12, the terminal for monitoring the voltage signal 13, and the bias control terminal 14 are omitted in the figures.

The first conductivity type silicon epitaxial layer 2 described above is formed so as to be thinner at the second pn diode array portion described above than at the other part by means of the p+ conductivity type buried layer 15 formed by implanting boron ions by the ion implantation method and then diffusing them, as indicated by Z in the figure.

This thickness Z of the epitaxial layer is 1 to 5 μm, preferably about 2 μm, while the other part is about 10 μm thick. FIGS. 1A to 1C illustrate examples differing in this thickness or the position in the thickness direction of the p+ conductivity type buried layer.

Although the basic operation of the element thus constructed is identical to that described for the invention of the older application, since the epitaxial layer 2 is formed so as to be thinner at the detecting portion by means of the p+ conductivity type buried layer, even in the case where the intensity of the input signal at the transducer means remains identical, the loss is smaller. Therefore the electric power of the SAW at the detecting portion is greater than that obtained by the invention of the older application and as the result it is possible to increase the intensity of the detected signal.

Next the fabrication method of the element having such a construction will be explained, referring to FIGS. 2A to 2D.

Figure 2A:
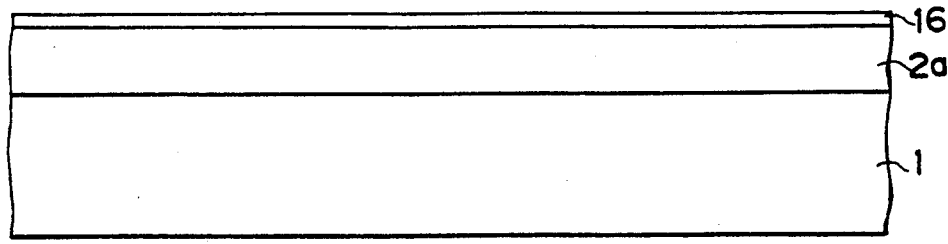
FIGS. 2A to 2D are schemes showing fabrication steps according to the present invention.

FIG. 2A: The first epitaxial layer 2a is formed on the p+ conductivity type Si substrate 1. This first epitaxial layer 2a is about 5 μm thick, in the case where the final epitaxial layer is 10 μm thick. Thereafter an $SiO_2$ layer 16 about 150 nm thick is formed as a buffer layer for an ion implantation described later.

Figure 2B:
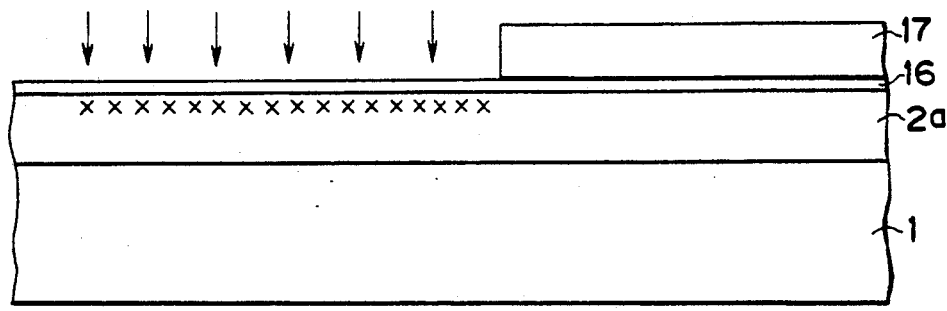

FIG. 2B: After having applied a photosensitive resin layer 17 on the whole surface, it is removed by the photolithographic method only at a region where the signal detecting portion is formed. Then boron ions are implanted at a relatively high dose rate by using the remaining photosensitive resin layer 17 as a mask.

Figure 2C:
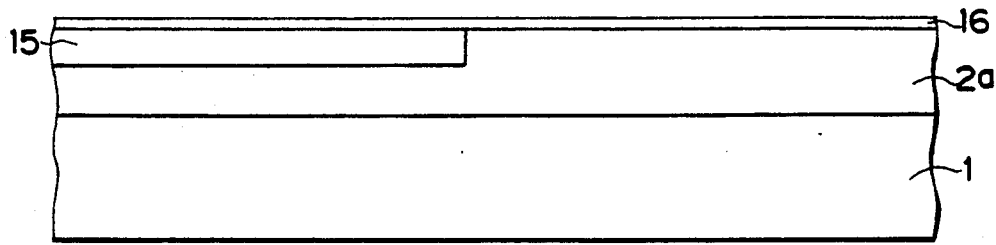

FIG. 2C: After having removed completely the photosensitive resin layer 17, the implanted boron ions are activated by a high temperature annealing treatment and at the same time they are deeply diffused to form the p+ conductivity type buried layer 15. Further, although in the present embodiment the p+ conductivity type buried layer was formed by the ion implantation method, it may be formed by the thermal diffusion method or the spin on method.

Figure 2D:
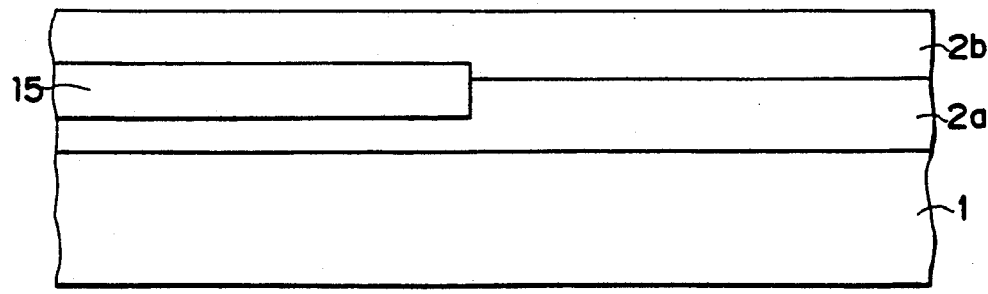

FIG. 2D: After having removed the $SiO_2$ buffer layer 16, the second epitaxial layer 2b having a same impurity concentration as the first epitaxial layer 2a described above. At this time, the layer thickness is about 5 μm.

Thereafter a photosensitive resin layer for forming p+ conductivity type region, in which a window is formed at the region corresponding to the p+ conductivity type high impurity concentration diffusion region 8, is formed on the thermal oxide layer 3 formed on the epitaxial layer 2, similarly to the process for the element indicated in FIG. 6.

After the boron implantation the p+ conductivity type high impurity concentration diffusion region 8 is formed by thermal treatment. After the removal of the photosensitive resin layer for forming the p+ conductivity type region, a photosensitive resin layer for forming the n+ conductivity type regions, in which windows are formed at the regions corresponding to the n+ conductivity type impurity diffusion regions 9 and 10, is formed. After a phosphor implantation the n+ conductivity type impurity diffusion regions 9 and 10 are formed by a thermal treatment. After the removal of the photosensitive resin layer for forming the n+ conductivity type regions the ZnO piezo-electric layer 4 is deposited by sputtering and the input and the output transducer means 5 and 6 and the gate electrode means 7 and 7' are formed on this ZnO piezo-electric layer to obtain the structures indicated in FIGS. 1A to 1C.

Figure 3:
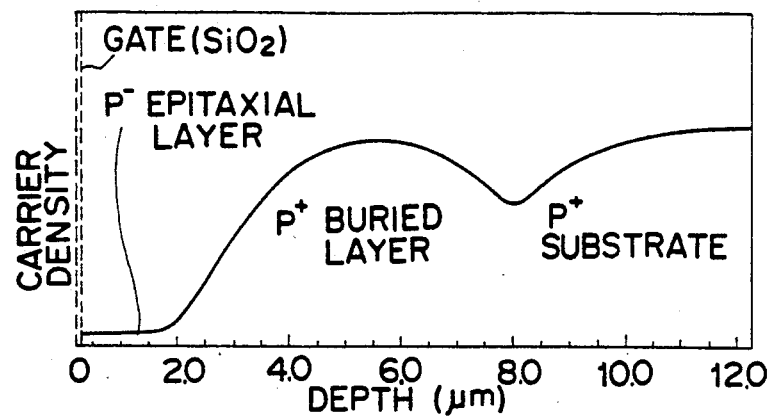
FIG. 3 is a scheme showing the construction of a part indicated by X—X' in FIGS. 1A to 1C.
Figure 4:
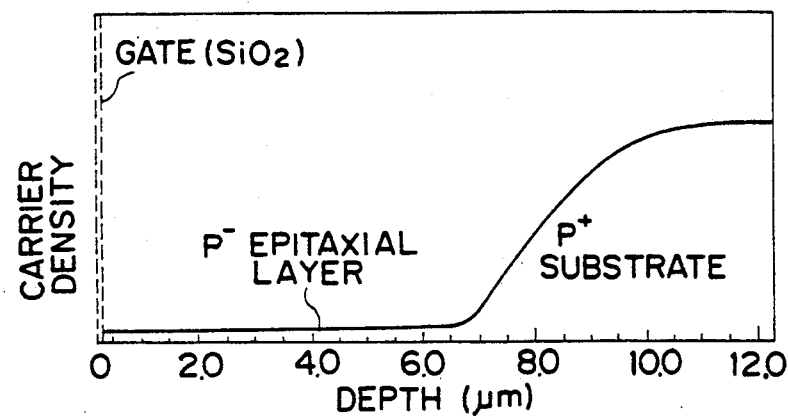
FIG. 4 is a scheme showing the construction of a part indicated by Y—Y' in FIGS. 1A to 1C.

FIG. 3 is a scheme showing the construction of a part indicated by X—X' (detecting portion) in FIGS. 1A to 1C; FIG. 4 is a scheme showing the construction of a part indicated by Y—Y' (filter portion); and FIG. 5 is a graph representing the relation between the specific resistance and the loss of SAW for different thicknesses of the epitaxial layer.

Figure 5:
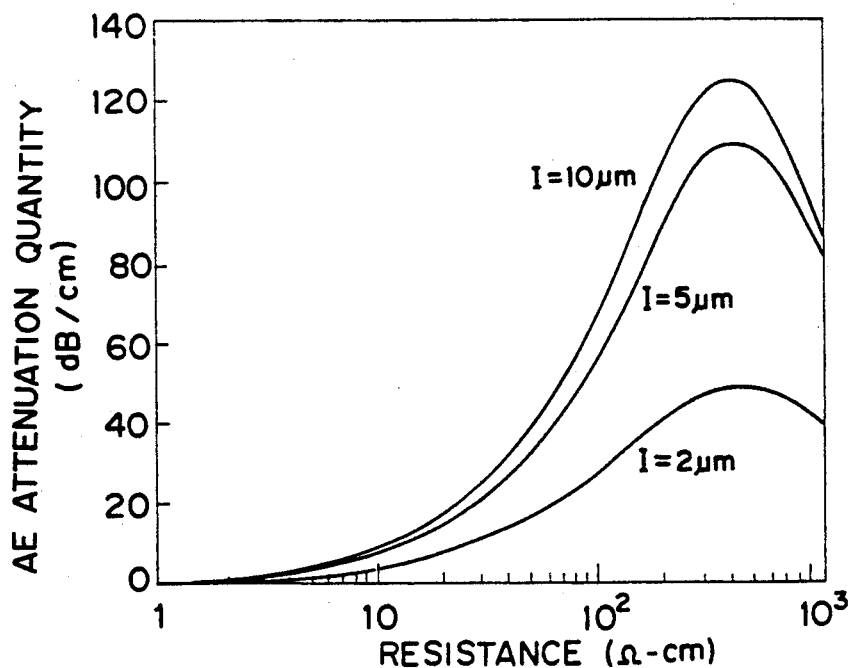
FIG. 5 is a graph representing the relation between the specific resistance and the loss of SAW for different thicknesses of the epitaxial layer.

Since the thickness Z of the epitaxial layer at the detecting portion can be reduced to about 2 μm by the fact that the epitaxial layer is formed, divided into two, and that the p+ conductivity type buried layer is formed only on the detecting portion after the first growth as by the fabrication method described above, as indicated by the experimental result in FIG. 5, it is possible to reduce the loss of the SAW by about 40 dB/cm for a specific resistance of 100 Ω·cm of the epitaxial layer with respect to the thickness (10 μm) by the prior art technique. Consequently, as described previously, even in the case where the intensity of the input signal at the transducer remains identical, since the loss of the SAW is reduced, the electric power of the SAW at the detecting portion is increased with respect to that obtained by the invention by the older application and as the result to increase the intensity of the detected signal.

As described above, by the construction of the surface acoustic wave devices according to the present invention, it is possible to increase the intensity of the detected signal at the detecting portion without changing characteristics of the filter portion. Therefore the signal processing at feeding back the detected signal to the filter portion becomes easier and an effect can be obtained that the S/N ratio is improved, etc.

Further, by the method for fabricating a surface acoustic wave device according to the present invention it is possible to obtain easily a surface acoustic wave element having an epitaxial layer, which is thinner at the signal detecting portion than at the filter portion, only by adding several modifications to the fabrication steps by the prior art method.

The embodiments of the invention in which an exclusive property or privilege is claimed are defined as follows:

1. A surface acoustic wave device comprising:
   a multi-layered structure including a first conductivity type high impurity concentration silicon substrate, a first conductivity type silicon epitaxial layer, an insulating layer and a piezo-electric layer;
   a group of input transducers formed on said piezo-electric layer and classifying an input signal in frequency to generate a plurality of surface acoustic waves at respective frequencies and propagating along respective propagation paths which each correspond to a respective one of said input transducers;
   a group of output transducers formed on said piezo-electric layer, each of the output transducers obtaining an output signal from a surface acoustic wave propagated along a respective one of the propagation paths;
   a group of gate electrodes formed on said piezo-electric layer, each of them corresponding to a respective one of said propagation paths;
   a group of first pn diode arrays formed on the surface side of said first conductivity type silicon epitaxial layer between the input and the output transducers, and each corresponding to a respective one of said propagation paths; and
   a group of second pn diode arrays formed on the surface side of said first conductivity type silicon epitaxial layer on a side of said input transducers opposite from said group of first pn diode arrays;
   wherein said first conductivity type silicon epitaxial layer is thinner in the region of the group of second pn diode arrays than in the region of the group of first pn diode arrays.

2. A surface acoustic wave device comprising:
   a first conductivity type high impurity concentration silicon substrate;
   a first conductivity type silicon epitaxial layer;
   a first conductivity type high impurity concentration buried layer formed partially in said epitaxial layer;
   first pn diode array means formed on the surface side of said first conductivity type silicon epitaxial layer in a region spaced from said buried layer;
   second pn diode array means formed on the surface side of said epitaxial layer above said buried layer;
   an insulating layer formed on said epitaxial layer;
   a piezo-electric layer formed further on said insulating layer;
   first gate electrode means formed on said piezo-electric layer above said first pn diode array means;
   second gate electrode means formed on said piezo-electric layer above said second pn diode array means;
   input transducer means formed on said piezo-electric layer between said first and said second gate electrode means; and
   output transducer means formed on said piezo-electric layer on a side of said first gate electrode means opposite from said input transducer means;
   wherein a portion of said epitaxial layer below said first pn diode array means is thicker than a portion of said epitaxial layer below said second pn diode means and above said buried layer.

3. A surface acoustic wave device according to claim 2, wherein said epitaxial layer includes a first epitaxial layer and a second epitaxial layer formed on said first epitaxial layer.

4. A surface acoustic wave device according to claim 2, wherein the thickness of said epitaxial layer, measured from an upper surface of said first conductivity type high impurity concentration buried layer to an upper surface of said epitaxial layer, is 1 $\mu$m to 5 $\mu$m.

* * * * *